(12) United States Patent
Omote et al.

(10) Patent No.: US 10,535,811 B2
(45) Date of Patent: Jan. 14, 2020

(54) PIEZOELECTRIC FILM AND PROCESS FOR PRODUCING SAME

(71) Applicant: IDEAL STAR INC., Miyagi (JP)

(72) Inventors: Kenji Omote, Miyagi (JP); Tsurugi Samezawa, Miyagi (JP); Hiroji Ohigashi, Miyagi (JP)

(73) Assignee: IDEAL STAR INC., Miyagi (JP)

( * ) Notice: Subject to any disclaimer, the term of this patent is extended or adjusted under 35 U.S.C. 154(b) by 117 days.

(21) Appl. No.: 15/563,739

(22) PCT Filed: Apr. 1, 2016

(86) PCT No.: PCT/JP2016/060933
§ 371 (c)(1),
(2) Date: Oct. 2, 2017

(87) PCT Pub. No.: WO2016/159354
PCT Pub. Date: Oct. 6, 2016

(65) Prior Publication Data
US 2018/0097171 A1 Apr. 5, 2018

(30) Foreign Application Priority Data
Apr. 2, 2015 (JP) ................................. 2015-075983

(51) Int. Cl.
*H01L 41/193* (2006.01)
*C08J 5/18* (2006.01)
(Continued)

(52) U.S. Cl.
CPC ............ *H01L 41/193* (2013.01); *C08F 14/22* (2013.01); *C08F 214/22* (2013.01); *C08J 5/18* (2013.01);
(Continued)

(58) Field of Classification Search
CPC .......... C08F 214/22; C08F 8/00; Y10T 29/42; Y10T 428/31544; Y10T 428/3154; H01L 41/193; H01L 41/45; Y10S 310/80
(Continued)

(56) References Cited

U.S. PATENT DOCUMENTS

| 5,679,753 A | 10/1997 | Ohigashi et al. |
| 2012/0000455 A1 | 1/2012 | Reinhold-Herrscher et al. |
| 2012/0004555 A1* | 1/2012 | Ohnuma ............... H01L 41/253 600/459 |

FOREIGN PATENT DOCUMENTS

| FR | 2550904 A1 * | 2/1985 | ........... H01L 41/193 |
| JP | 08-36917 | 2/1996 | |

(Continued)

OTHER PUBLICATIONS

International Search Report, PCT/JP2016/060933, dated Jun. 21, 2016.

*Primary Examiner* — Betelhem Shewareged
(74) *Attorney, Agent, or Firm* — Young & Thompson

(57) ABSTRACT

A piezoelectric film which is better in heat and deformation resistant properties than those in the prior art is provided along with a method of manufacture. The film is a piezoelectric film that is composed of a copolymer of vinylidene fluoride and trifluoroethylene, the copolymer having a content of vinylidene fluoride in a range of not less than 82 mol % and not more than 86 mol % and having a molecular weight not less than 600,000. The piezoelectric film is subjected to a heat treatment for crystallization of the copolymer at a temperature ranging from not less than 140° C. to not more than 150° C., and is thereby caused to develop piezoelectric property. The piezoelectric film further has a heat resistance of not less than 140° C. and a breaking
(Continued)

distortion of not less than 8% and not more than 55%, and an excellent deformation resistant property.

5 Claims, 4 Drawing Sheets

(51) Int. Cl.
    *H01L 41/45*     (2013.01)
    *C08F 214/22*     (2006.01)
    *C09D 127/16*     (2006.01)
    *C08F 14/22*     (2006.01)
    *H01L 41/02*     (2006.01)

(52) U.S. Cl.
    CPC ............ *C09D 127/16* (2013.01); *H01L 41/02* (2013.01); *H01L 41/45* (2013.01)

(58) Field of Classification Search
    USPC ...................................................... 428/195.1
    See application file for complete search history.

(56) References Cited

FOREIGN PATENT DOCUMENTS

| | | |
|---|---|---|
| JP | 2011-80058 | 4/2011 |
| JP | 2012-082378 | 4/2012 |
| WO | WO2010/016291 | 2/2010 |
| WO | WO2010/106924 | 9/2010 |

\* cited by examiner

Fig. 4

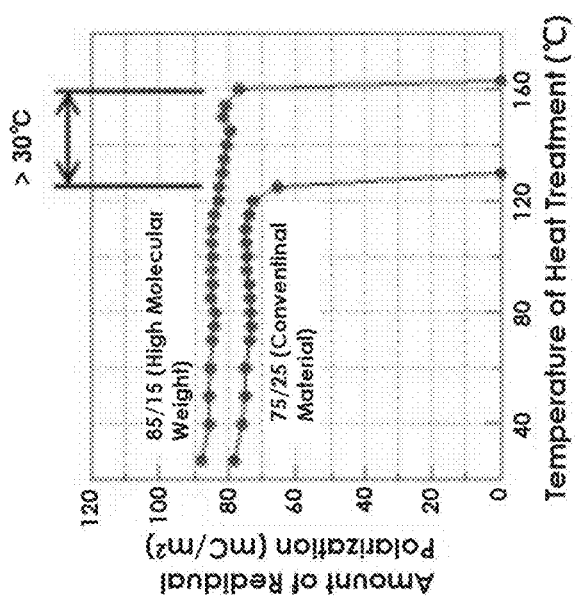

THermal Characteristics of Piezoelectric Films

Having undergone the heat treatment at a respective temperature fpr a period of 30 minutes, a piezoelectric film is left at room temperature for a period of 15 minutes and then has its heat heat hysterisis is measured.

It has been confirmed that a P [VDF / TrFE of 85 / 15] (higher molecular weight) crystallized film is higher in heat resistance than a P [VDF TrFE of 75 / 25] crystallized film by 30°C or more

PIEZOELECTRIC FILM AND PROCESS FOR PRODUCING SAME

TECHNICAL FIELD

The present invention relates to a piezoelectric film and also to a method of its making, the piezoelectric film being composed of a copolymer of vinylidene fluoride (VDF) and trifluoroethylene (TrFE), the copolymer being of a molecular weight of not less than 600,000 (/mol), whereby there are improvements in a heat resistance as measured by an upper limit of the temperature (Curie point) at which the piezoelectricity (ferroelectricity) can be retained and in a resistance to deformation as measured by a breaking distortion or strain.

BACKGROUND ART

Known as a high polymer having ferroelectricity, copolymer P [VDF/TrFE] of vinylidene fluoride (VDF) and trifluoroethylene (TrFE) has good piezoelectricity and large spontaneous polarization (residual polarization) and is being investigated of its application to a variety of elements and devices such as a piezoelectric sensor/transducer and an infrared pyroelectric sensor on making use of its flexibility and machinability. In patent documents 1 and 2 published, there are proposals on piezoelectric films made of mixtures (blends) of copolymer P [VDF/TrFE] and fullerene hydroxide and/or carbon nanotube.

PRIOR ART REFERENCE

Patent Reference

Patent Document 1: 2011-080058 A
Patent Document 2: 2012-082378 A

DISCLOSURE OF THE INVENTION

Problems to be Solved by the Invention

Ferroelectric copolymers P [VDF/TrFE] so far known in the art have had a drawback, however, of being inferior in heat resistance and resistance to deformation, which have been insufficient or unsatisfactory for their individual applications. The piezoelectric film used for a blend film of copolymer P [VDF/TrFE] described in Patent Documents 1 and 2 is a piezoelectric film of which the ratio in mol % of VDF/TrFE is 75/25, giving rise to the problem that resistance to deformation is inferior and heat resistance is insufficient, too.

It is an object of the present invention to provide a piezoelectric film which is superior in heat resistant and deformation resistant properties to those in the prior art and also to provide a method of making such a piezoelectric film.

Means for Solving the Problems

In accordance with the present invention, as set forth in claim 1 of the claims there is provided a piezoelectric film composed of a copolymer of vinylidene fluoride and trifluoroethylene, characterized in that: the copolymer has a content of vinylidene fluoride in a range of not less than 82 mol % and not more than 86 mol % and the copolymer has a molecular weight of not less than 600,000 (/mol).

It has been found that the film deteriorates its piezoelectric property disadvantageously if vinylidene fluoride is contained in the copolymer at a proportion reduced to less than 82 mol % and further that the film deteriorates the piezoelectric property, too, disadvantageously if vinylidene fluoride is contained in the copolymer at a proportion made to exceed 86 mol %.

It has also been found that the piezoelectric film deteriorates its deformation or distortion resistance disadvantageously if the copolymer has a molecular weight less than 600,000 (/mol).

The present invention as set forth in claim 2 of the claims specifically provides a piezoelectric film as set forth in claim 1, characterized in that the said piezoelectric film comprises a film of the said copolymer which is coated on a substrate and dried thereon, whereon the said film dried is heat-treated at a temperature in a range of not less than 140° C. and not more than 150° C. for crystallization of the copolymer to develop a piezoelectric property thereof.

It has been found that if the heat treatment is effected at a temperature less than 140° C., the film disadvantageously fails to develop enough piezoelectric property due to the insufficient heat-treatment temperature and that a temperature in excess of 150° C. for the heat treatment disadvantageously deteriorates the piezoelectric film.

The present invention as set forth in claim 3 of the claims specifically further provides a piezoelectric film as set forth in claim 1 or claim 2, characterized in that the said piezoelectric film has a heat resistance of not less than 140° C. and is excellent in deformation resistance, having a breaking strain of not less than 8% and not more than 55%.

In accordance with the present invention there is also provided, as set forth in claim 4 of the claim, a method of making a piezoelectric film, characterized in that it comprises the steps of preparing a solution containing a solvent and a copolymer of vinylidene fluoride and trifluoroethylene in which vinylidene fluoride is contained at a proportion in a range of not less than 82 mol % and not more than 86 mol % and whose molecular weight is not less than 600,00 (/mol); coating and drying the solution on a substrate to form a film of the copolymer thereon; and subjecting the said film to a heat treatment at a temperature in a range of not less than 140° C. and not more than 150° C. for crystallization of the copolymer, thereby developing a piezoelectric property thereof.

The present invention as set forth in claim 5 of the claims specifically further provides a method of making a piezoelectric film as set forth in claim 4, characterized in that the said piezoelectric film made has a heat resistance of not less than 140° C. and a breaking distortion in a range from not less than 8% to not more than 55%.

Effects of the Invention

According to the features of claim 1, claim 2, and/or claim 3, it has been found possible to provide a piezoelectric film which is superior in heat resistant and deformation or distortion resistant properties to those in the prior art.

According to the features of claim 4 and/or claim 5, it has been found possible to provide a method of making a piezoelectric film having heat resistant and deformation resistant properties superior to those of the conventional piezoelectric films.

According to the present invention, it has been found possible to provide a piezoelectric film which is superior in heat resistant and deformation or distortion resistant properties to those in the prior art and to provide a method of making such a piezoelectric film.

BRIEF DESCRIPTION OF THE DRAWINGS

In the Drawings:

FIG. 4 is a graph of comparative data of heat resistance of a specimen of piezoelectric film of copolymer crystallized in which the VDF/TrFE compounding ratio is 85/15 (higher molecular weight) and heat resistance of a specimen of piezoelectric film of copolymer crystallized in which the VDF/TrFE compounding ratio is 75/25.

MODES FOR CARRYING OUT THE INVENTION

A piezoelectric film in a form of embodiment of the present invention, which is composed of a copolymer of vinylidene fluoride and trifluoroethylene, is featured in that vinylidene fluoride is contained in a range of not less than 82 mol % and not more than 86 mol % and that the copolymer has a molecular weight in a range of not less than 600,000 (/mol).

The piezoelectric film mentioned above is in the form of a film of the composition which is coated on a substrate and is then dried and formed thereon. The formed film of that copolymer is thereafter subjected to a heat treatment at a temperature in a range of not less than 140° C. and not more than 150° C. and is thereby crystallized to develop a piezoelectric property.

The piezoelectric film that results has a heat resistance of not less than 140° C. and an excellent distortion or deformation resistance as measured by a breaking strain or distortion of not less than 8% and not more than 55%.

The method of making a piezoelectric film in a form of implementation of the present invention is featured in that a mixture or solution of a solvent and a copolymer of vinylidene fluoride and trifluoroethylene in which vinylidene fluoride is contained at a proportion in a range of not less than 82 mol % and not more than 86% and whose molecular weight is not less than 600,000 (/mol) is coated on a substrate and then dried to form a film of the copolymer, which is thereafter subjected to a heat treatment at a temperature in a range of not less than 140° C. and not more than 150° C. and thereby crystallized to develop a piezoelectric property.

The said piezoelectric film has a heat resistance of not less than 140° C. and a breaking distortion of not less than 8% and not more than 55%.

Example 1

Figure 1:
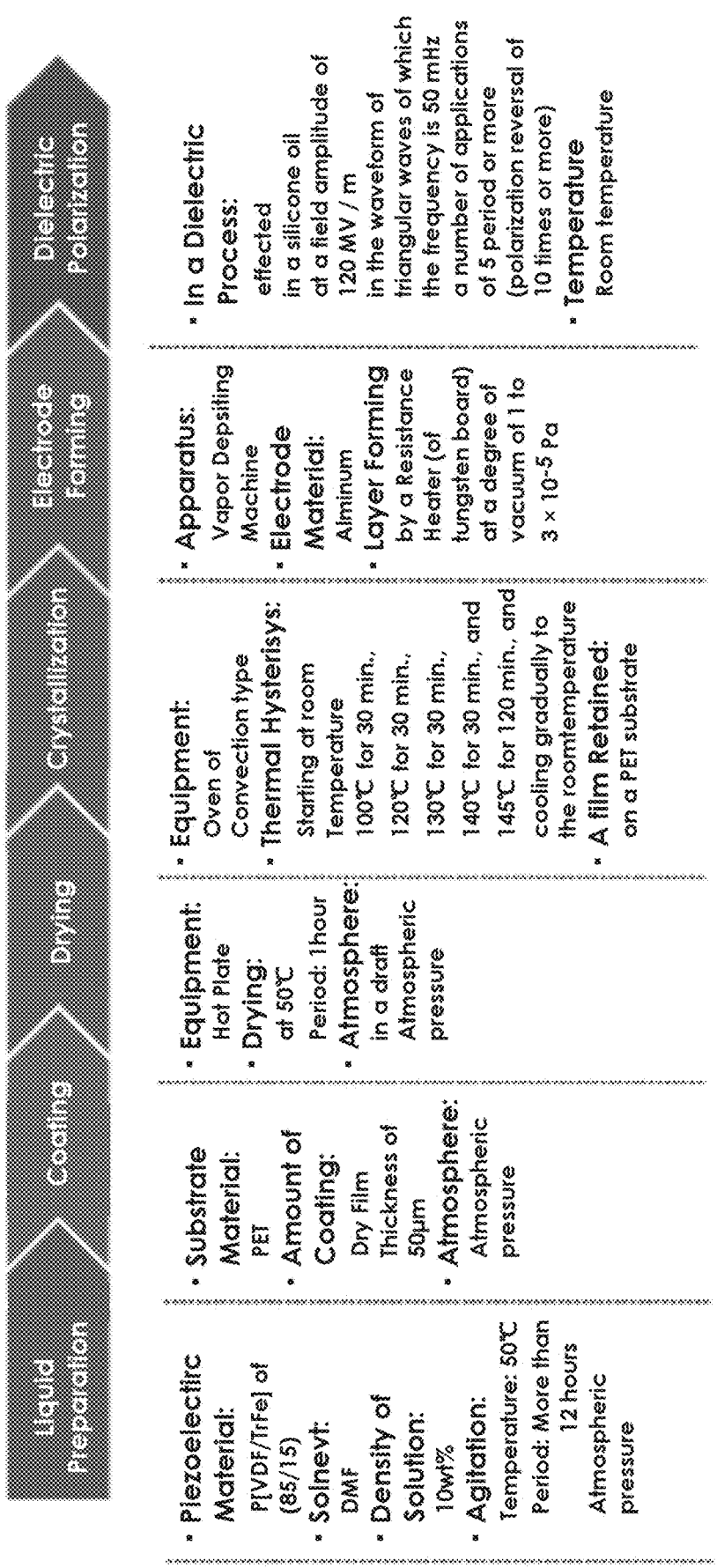
FIG. 1 is a flow chart of process steps of a method of making a piezoelectric film in a form of implementation of the present invention.

FIG. 1 is a flow chart of process steps of a method of making a piezoelectric film. The method or process of making a piezoelectric film is carried out in the process steps in the order indicated: the step of liquid preparation followed by →coating step→drying step→step of heat treatment for crystallizing→step of electrode forming→step of dielectric polarization to provide a P [VDF/TrFE] piezoelectric film.

For a detailed description of these individual process steps, mention is made in order below Step of Liquid Preparation:

A liquid solution is prepared containing a copolymer of vinylidene fluoride (VDF) and trifluoroethylene (TrFE), and a solvent (DMF).

Coating Step:

A PET material to constitute a substrate is prepared, and the said solution is coated on the said PET substrate to form a film of coating which dried at normal room temperature has a thickness of 50 μm.

Drying Step:

Using a hot plate as drying equipment, the film of coating is dried in a draft under an atmospheric pressure at a temperature of 80° C. for a period of 1 hour.

Heat Treatment for Crystallization

In an oven of convection type as equipment, the film is heat-treated at a temperature in a range from not less than 140° C. to not more than 150° C. for crystallization of the copolymer to develop a piezoelectric property thereof.

Electrode Forming:

Using a vacuum evaporator of resistance heating type, aluminum is evaporated by heating under an atmospheric pressure in a range between 1 and $3 \times 10^{-5}$ Pa to form an aluminum electrode layer on each of both sides of the film.

Dielectric Polarization:

A step of polarization treatment is effected in which the film is disposed in silicone oil and a voltage in the form of triangular waves or pulses of an amplitude of 120 MV/m and a frequency of 50 mHz is applied in 5 periods or more directly across the electrodes layered on the film Table 1 below is a comparative table showing in numerical value the tensile strengths, breaking strains and elastic moduli of piezoelectric films which embody the invention (products of invention 1 and 2) comparatively with the tensile strengths, breaking strains and elastic moduli of piezoelectric films which are comparative examples in the prior art (comparative products 1 and 2).

From Table 1, it is seen that the piezoelectric films of the products of invention 1 and 2 of which the molecular weights are not less than 600,000 (/mol) have a tensile strength of about 40 MPa and have breaking strains or distortions of 20 to 50% and 10 to 40%, respectively, on the one hand. On the other hand, it is seen that the piezoelectric films of the comparative products 1 and 2 of which the molecular weights are 352,000 (/mol) or less have a tensile strength of about 40 MPa and a breaking distortion or strain of 5 to 15% and 3 to 7%, respectively, making it manifest that the piezoelectric films of the products of invention 1 and 2 are higher in value of breaking strain than, and superior in distortion or deformation resistance to, those of the comparative products.

TABLE 1

|  | Molecular Weight MW [/mol] | Residual Polarization Nr [Mc/m$^2$] | Coercive Electric Field [Mv/m] | Tensile Strength [MPa] | Breaking Strain [%] | Elastic Modulus [GPa] |
| --- | --- | --- | --- | --- | --- | --- |
| Product of Invention 1 | 680,000 | 89.3 | 39.6 | about 40 | 20-50 | about 3 |
| Product | 602,000 | 90.4 | 38.7 | about | 10-40 | about |

TABLE 1-continued

| | Molecular Weight MW [/mol] | Residual Polarization Nr [Mc/m$^2$] | Coercive Electric Field [Mv/m] | Tensile Strength [MPa] | Breaking Strain [%] | Elastic Modulus [GPa] |
|---|---|---|---|---|---|---|
| of Invention 2 | | | | 40 | | 3 |
| Comparative Product 1 | 352,000 | 82.1 | 38.5 | about 40 | 5-15 | about 3 |
| Comparative Product 2 | 350,000 | unassessed | unassessed | about 40 | 3-7 | about 3 |

Note
that the ratio of molar % of VDF/TrFE is set at 85/15.

Figure 2:
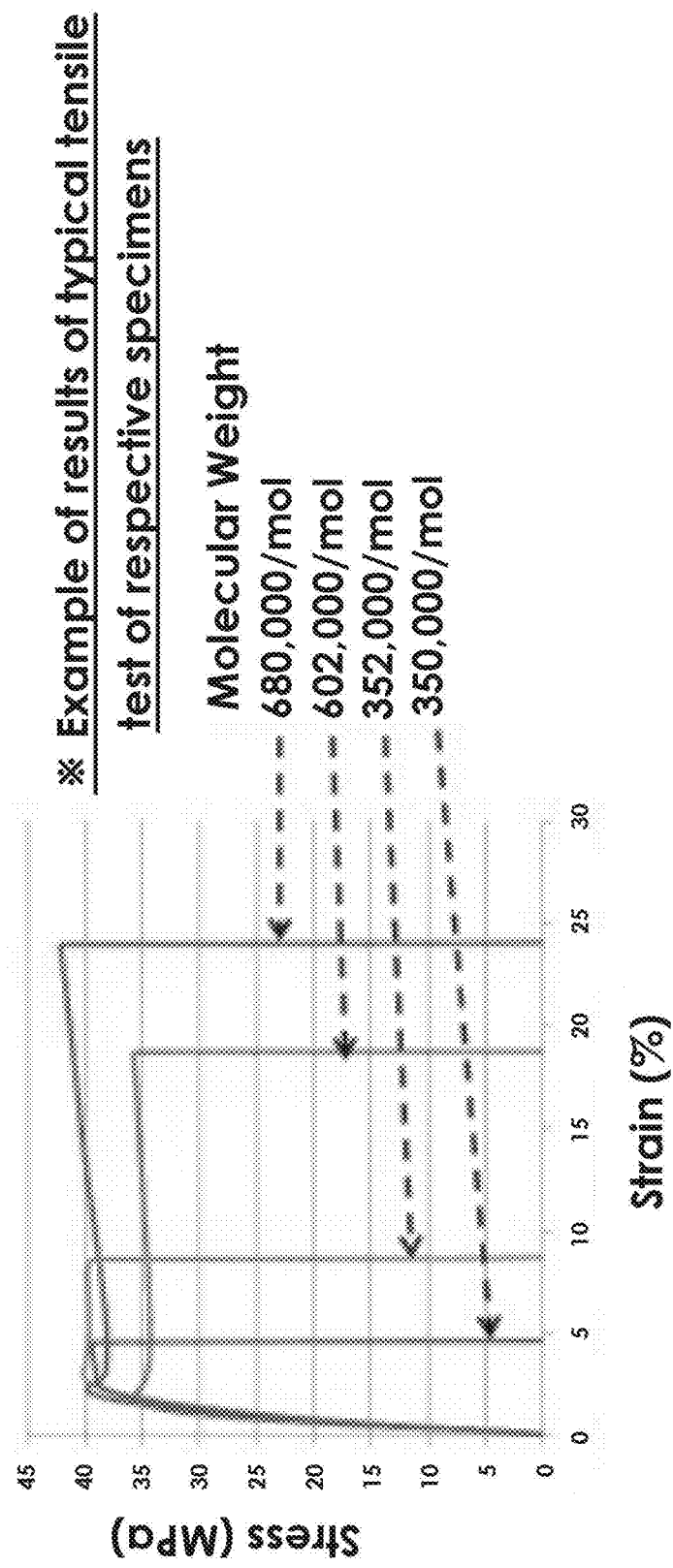
FIG. 2 is a graph illustrating a relationship between stress (MPa) and strain or distortion (%) of a piezoelectric film P with VDF/TrFE=85/15)

FIG. 2 is a graph showing a relation of 1 stress (MPa) versus a strain or distortion (%) of a piezoelectric film P [VDF/TrFE]. It is seen that the greater the molecular weight, the larger is the breaking strain, and the larger the tensile strength, the higher is the distortion resistance. It has been found that two samples of a molecular weight of not less than 600,00 (/mol) has a breaking strain or distortion of 18% or more and has a distortion resistance of more than twice as much as that of 8% of two samples having a molecular weight of 350,000 (/mol).

Example 3

Figure 3:
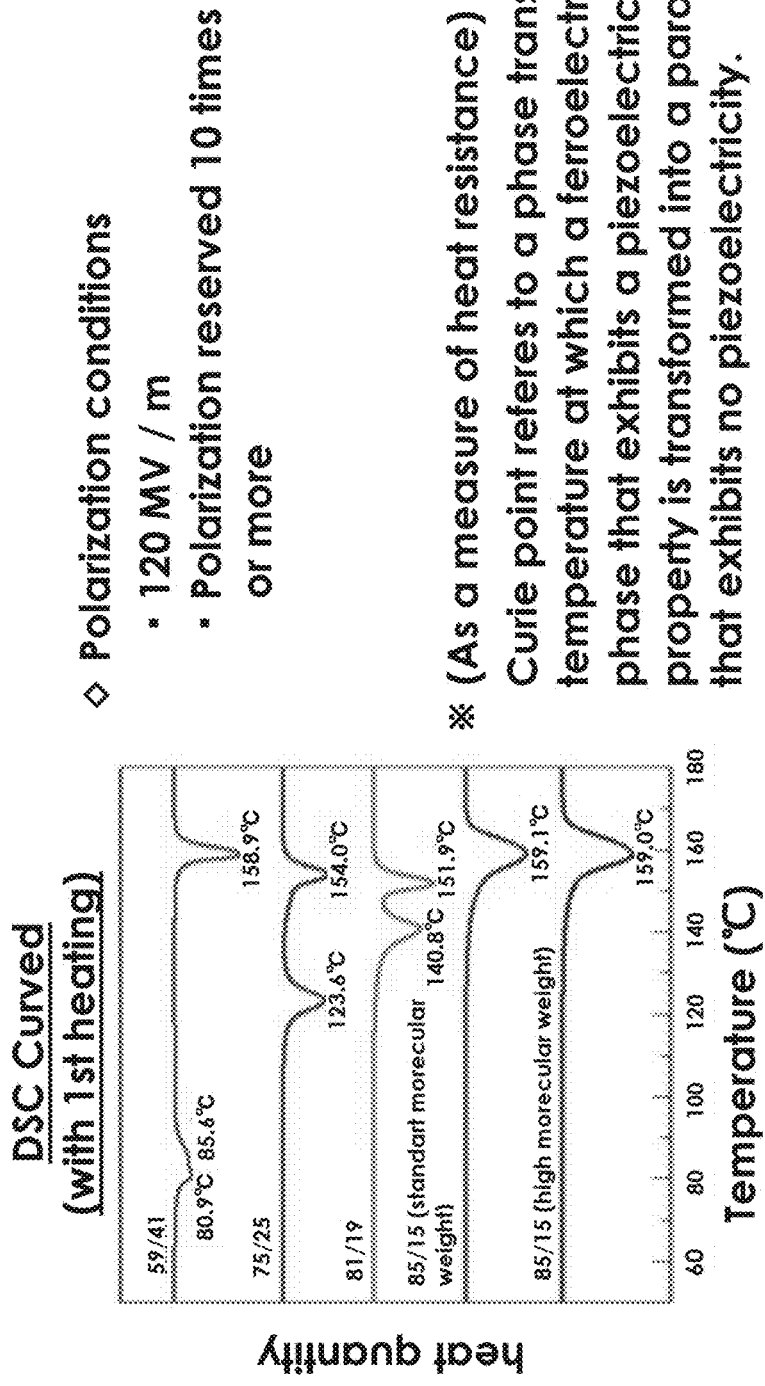
FIG. 3 is a graph illustrating thermal characteristics relating to specimens of varied compounding ratios of a piezoelectric film P [VDF/TrFE]

FIG. 3 shows thermal characteristics of piezoelectric film (P [VDF/TrFE]) samples with varied compounding ratios. In FIG. 3, it is indicated that for the piezoelectric film samples whose VDF/TrFE proportions are 59/41, 75/25 and 81/19, there exist endothermic peaks corresponding to Curie points at temperatures of 141° C. or less, on the one hand.

Note the term Curie point refers to a temperature at which a ferroelectric phase that exhibits piezoelectricity is transformed into a paraelectric phase that exhibits no piezoelectricity.

On the other hand, it is indicated for the two samples whose VDF/TrFE proportions are 85/15, there is no endothermic peak corresponding to their Curie point of 159° C. that is their melting point. Consequently, it has been confirmed that the specimen of the piezoelectric film whose VDF/TrFE proportion is 85/15 is extremely good in heat resistance at high temperatures.

FIG. 4 shows comparative data of the Curie point as a measure of heat resistance of a piezoelectric film specimen whose VDF/TrFE proportion is 85/15 (higher molecular weight) and heat resistance of a piezoelectric film specimen whose VDF/TrFE proportion is 75/25. It has been confirmed that the 85/15 (higher molecular weight) crystallized film specimen is better in heat resistance by 30° C. or more than the 75/25 crystallized film specimen.

Example 4

Table 2 below is a comparative table showing the piezoelectric properties and heat resistances (here Curie points) of a specimen of piezoelectric film whose VDF/TrFE proportion is 85/15 (of higher molecular weight, a product of invention 3) and a specimen of piezoelectric film whose VDF/TrFE proportion is 75/25 (comparative products 3, 4, 5). With respect to heat resistance, it is seen on the one hand that the product of invention 3 is of 156° C. and superior to the comparative products 3, 4 and 5 which are of 120° C. to 130° C.

On the other hand, with respect to the piezoelectricity, it is seen that the product of invention 3 is equal to the comparative products 3, 4 and 5.

TABLE 2

| | Molar Fraction Of VDF (%) | Distortion Resistance | Electromechanical Coupling Coefficient K33 | Electromechanical Coupling Coefficient K31 | Heat Resistance (Curie Point) |
|---|---|---|---|---|---|
| Product of Invention 3 | 85 | Very good | 0.28 | 0.08 | 156° C. |
| Comparative Product 3 | 75 | Not good | 0.3 | 0.06 | 120° C. |
| Comparative Product 4 | 75 | Not good | 0.3 | 0.06 | 120° C. |
| Comparative Product 5 | 81 | Good | 0.24 | 0.08 | 130° C. |

INDUSTRIAL APPLICABILITY OF THE INVENTION

According to the present invention, it is made possible to provide a piezoelectric film and a method of its making, the piezoelectric film being superior in heat resistant and distortion or deformation resistant properties to those in the prior art. It is made thereby possible to apply the piezoelectric film to its industrial uses and to applications in the automotive industry (a specific example of which includes disposing a piezoelectric film of the present invention on an inner surface of a tyre to measure a stress applied thereto), thereby contributing to development of the industries.

What is claimed is:

1. A piezoelectric film composed of a copolymer of vinylidene fluoride and trifluoroethylene, wherein: the copolymer has a content of vinylidene fluoride in a range of not less than 82 mol % and not more than 86 mol %, the copolymer has a molecular weight of not less than 600,000 (/mol), and the piezoelectric film comprises a film of the copolymer which is coated on a substrate and dried thereon, wherein the film dried is heat-treated at a temperature in a range of not less than 140° C. and not more than 150° C. for crystallization of the copolymer to develop a piezoelectric property thereof.

2. A piezoelectric film as set forth in claim 1, wherein said piezoelectric film has a heat resistance of not less than 140° C. and is good in deformation resistance, having a breaking distortion of not less than 8% and not more than 55%.

3. A method of making a piezoelectric film, further comprising the steps of preparing a solution containing a solvent and a copolymer of vinylidene fluoride and trifluoroethylene in which vinylidene fluoride is contained at a proportion in a range from not less than 82 mol % to not more than 86 mol % and whose molecular weight is not less than 600,00 (/mol); coating and drying the solution on a substrate to form a film of the copolymer thereon; and subjecting said film to a heat treatment at a temperature in a range of not less than 140° C. and not more than 150° C. for crystallization of the copolymer, thereby developing a piezoelectric property thereof.

4. A method of making a piezoelectric film as set forth in claim 3, wherein the piezoelectric film made has a heat resistance of not less than 140° C. and a breaking strain in a range of not less than 8% and not more than 55%.

5. A piezoelectric film composed of a copolymer of vinylidene fluoride and trifluoroethylene, wherein: the copolymer has a content of vinylidene fluoride in a range of not less than 82 mol % and not more than 86 mol %, the copolymer has a molecular weight of not less than 600,000 (/mol), and the piezoelectric film has a heat resistance of not less than 140° C. and is good in deformation resistance, having a breaking distortion of not less than 8% and not more than 55%.

* * * * *